US008329218B2

(12) United States Patent
Ediger et al.

(10) Patent No.: US 8,329,218 B2
(45) Date of Patent: Dec. 11, 2012

(54) UNUSUALLY STABLE GLASSES AND METHODS FOR FORMING SAME

(75) Inventors: Mark D. Ediger, Madison, WI (US); Stephen Swallen, Madison, WI (US); Ken Kearns, Madison, WI (US); Lian Yu, Madison, WI (US); Tian Wu, Lake Bluff, IL (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1211 days.

(21) Appl. No.: 12/040,242

(22) Filed: Feb. 29, 2008

(65) Prior Publication Data

US 2008/0213365 A1 Sep. 4, 2008

Related U.S. Application Data

(60) Provisional application No. 60/892,410, filed on Mar. 1, 2007.

(51) Int. Cl.
*A61K 9/28* (2006.01)
(52) U.S. Cl. .................. 424/474; 428/426; 427/248.1; 427/2.14; 523/214
(58) Field of Classification Search .................. None
See application file for complete search history.

(56) References Cited

U.S. PATENT DOCUMENTS 6,274,159 B1 * 8/2001 Marotta et al. ............... 424/426

OTHER PUBLICATIONS

Forster, Angus, et al., "Characterization of glass solutions of poorly water-soluble drugs produced by melt extrusion with hydrophilic amorphous polymers", Journal of Pharmacy and Pharmacology, Mar. 2001, vol. 53, No. 3, pp. 303-315.*
Kauzmann, W., "The Nature of the Glassy State and the Behavior of Liquids at Low Temperatures," Department of Chemistry, Princeton University, pp. 219-256 (Mar. 1, 1948).
Plazek, D.J. et al., "Physical Properties of Aromatic Hydrocarbons. I. Viscous and Viscoelastic Behavior of 1:3:5-Tri-α-Naphthyl Benzene," *The Journal of Chemical Physics*, vol. 45, No. 8, pp. 3038-3050 (Oct. 15, 1966).
Magill, J.H., "Physical Properties of Aromatic Hydrocarbons. III. A Test of the Adam-Gibbs Relaxation Model for Glass Formers Based on the Heat-Capacity Data of 1,3,5-tri-α-Naphthylbenzene," *The Journal of Chemical Physics*, vol. 47, No. 8, pp. 2802-2807 (Oct. 15, 1967).
Hikawa, H. et al., "Construction of an Adiabatic Calorimeter for a Vapor-Deposited Sample and Thermal Characterization of Amorphous Butyronitrile," *Journal of Non-Crystalline Solids*, vol. 101, No. 1, pp. 90-100 (Apr. 1988); published by Elsevier Science Publishers B.V.
Oguni, M. et al., "Enthalpy Relaxation in Vapor-Deposited Butyronitrile," *Thermochimica Acta*, vol. 158, pp. 143-156 (1990); published by Elsevier Science Publishers B.V., Amsterdam.
Takeda, K. et al., "A DTA Apparatus for Vapour-Deposited Samples.

Characterisation of Some Vapour-Deposited Hydrocarbons," *Thermochimica Acta*, vol. 158, pp. 195-203 (1990); published by Elsevier Science Publishers B.V., Amsterdam.
Takeda, K. et al., "Thermodynamic characterization of vapor-deposited amorphous solid," *Thermochimica Acta*, vol. 253, pp. 201-211 (1995); published 1995 by Elsevier Science B.V.
Takeda, K. et al., "Calorimetric Study on Structural Relaxation of 1-Pentene in Vapor-Deposited and Liquid-Quenched Glassy States," *J. Phys. Chem.*, vol. 99, pp. 1602-1607 (1995); published by American Chemical Society.
Stillinger, F. et al., "A Topographic View of Supercooled Liquids and Glass Formation," *Science, New Series*, vol. 267, No. 5206, pp. 1935-1939 (Mar. 31, 1995); published by American Association for the Advancement of Science.
Whitaker, C.M. et al., "Synthesis and Characterization of Organic Materials with Conveniently Accessible Supercooled Liquid and Glassy Phases: Isomeric 1,3,5-Tris(naphthyl)benzenes," *J. Phys. Chem.*, vol. 100, pp. 1081-1090 (1996); published by American Chemical Society.
Tsukushi, I. et al., "A calorimetric study on the configurational enthalpy and low-energy excitation of ground amorphous solid and liquid-quenched glass of 1,3,5-tri-α-naphthylbenzene," *J. Phys.: Condens. Matter*, vol. 8, pp. 245-255 (1996); published by IOP Publishing Ltd.
Ediger, M.D. et al., "Supercooled Liquids and Glasses," *J. Phys. Chem.*, vol. 100, pp. 13200-13212, (1996); published by American Chemical Society.
Andronis, V. et al., "Effects of Sorbed Water on the Crystallization of Indomethacin from the Amorphous State," *Journal of Pharmaceutical Sciences*, vol. 86, No. 3, pp. 346-351 (Mar. 1997); published by American Chemical Society and American Pharmaceutical Association.
Angell, C.A., "Entropy and fragility in supercooling liquids," *Journal of Research of the National Institute of Standards and Technology*, vol. 102, pp. 171-185 (Mar./Apr. 1997).
Yamamuro, O. et al., "Enthalpy relaxation of glassy glycerol prepared by rapid liquid quenching," *Journal of Non-Crystalline Solids*, 235-237, pp. 517-521 (1998); published by Elsevier Science B.V.
Suga, H., "Thermodynamic aspects of glassy states," *Journal of Molecular Liquids*, vol. 81, pp. 25-36 (1999); published by Elsevier Science B.V.
Ishii, K. et al., "Density Inhomogeneity in Amorphous Chlorobenzene Vapor-Deposited on Cold Substrates," *Bull. Chem. Soc. Jpn.*, vol. 74, pp. 435-440 (2001); published by The Chemical Society of Japan.
Debenedetti, P.G. et al., "Supercooled liquids and the glass transition," *Nature*, vol. 410, pp. 259-267 (Mar. 8, 2001); published by Macmillan Magazines Ltd.
Ishii, K. et al., "Excess Volume of Vapor-Deposited Molecular Glass and Its Change Due to Structural Relaxation: Studies of Light Interference in Film Samples," *J. Phys. Chem. B.*, vol. 107, pp. 876-881 (2003); published by American Chemical Society; published on Web Dec. 28, 2002.
Bell, R.C. et al., "Nanometer-Resolved Interfacial Fluidity," *J. Am. Chem. Soc.*, vol. 125, pp. 5176-5185 (2003); published by American Chemical Society.

(Continued)

Primary Examiner — Robert A Wax
Assistant Examiner — Hasan Ahmed
(74) Attorney, Agent, or Firm — Bell & Manning, LLC

(57) ABSTRACT

The present invention provides vapor deposition methods that overcome the kinetic restrictions imposed by more conventional vapor deposition processes and liquid-cooling techniques to form amorphous molecular solids with greatly enhanced stabilities. The present methods produce amorphous molecular solids having stabilities, as measured by fictive temperature, that cannot be achieved using liquid-cooling methods.

13 Claims, 15 Drawing Sheets

OTHER PUBLICATIONS

Richert, R. et al., "Dynamics of glass-forming liquids. VII. Dielectric relaxation of supercooled *tris*-naphthylbenzene, squalane, and decahydroisoquinoline," *Journal of Chemical Physics*, vol. 118, No. 4, pp. 1828-1836 (Jan. 22, 2003); published by American Institute of Physics.

Faupel, F. et al., "Diffusion of metallic glasses and supercooled melts," *Reviews of Modern Physics*, vol. 75, pp. 237-280 (Feb. 24, 2003); published by The American Physical Society.

Ishii, K. et al., "Structural relaxation as a forked road to crystallization and glass transition of vapor-deposited amorphous molecular systems," *Chemical Physics Letters*, vol. 398, pp. 377-383 (2004); published by Elsevier B.V.

Diurisic, A.B. et al., "Influence of atmospheric exposure of tris (8-hydroxyquinoline) aluminum ($Alq_3$): a photoluminescence and absorption study," *Appl. Phys. A.*, vol. 78, pp. 375-380 (2004).

Swallen, S. et al., "Neutron reflectivity measurements of the translational motion of tris(naphthylbenzene) at the glass transition temperature," *The Journal of Chemical Physics*, vol. 124, pp. 184501-1-184501-9 (May 8, 2006); published by American Institute of Physics.

Swallen, S. et al., "Organic Glasses with Exceptional Thermodynamic and Kinetic Stability," *Science*, vol. 315, pp. 353-356; published online Dec. 7, 2006.

Kearns, K. et al., "Influence of substrate temperature on the stability of glasses prepared by vapor deposition," *The Journal of Chemical Physics*, vol. 127, pp. 154702-1-154702-9 (2007); published by American Institute of Physics.

Kovacs, A. J., "Transition vitreuse dans les polymers amorphes. Etude phenomenologique," Fortschr. Hoschpolym.-Forsch., Bd. 3, pp. 394-507 (1963).

\* cited by examiner

UNUSUALLY STABLE GLASSES AND METHODS FOR FORMING SAME

CROSS-REFERENCE TO RELATED APPLICATIONS

This application claims the benefit of U.S. Provisional Patent Application Ser. No. 60/892,410 filed Mar. 1, 2007, the entire disclosure of which is incorporated by reference.

STATEMENT OF GOVERNMENT RIGHTS

This invention was made with United States government support awarded by the following agencies: NSF, under grants Nos. 0245674 and 0210588; and USDA/CSREES, under grant No. 2005-35503-16303. The United States government has certain rights in this invention.

FIELD OF THE INVENTION

This invention generally pertains to stable molecular glasses and methods for making the glasses using vapor deposition.

BACKGROUND OF THE INVENTION

Amorphous materials combine the disordered structure of a liquid with the mechanical properties of a solid. These materials can be described in terms of a potential energy landscape, with thermodynamics and kinetics controlled by the minima and barriers on the landscape, respectively (C. A. Angell, *J. Res. Natl. Inst. Stand. Technol.* 102, 171 (1997); P. G. Debenedetti, F. H. Stillinger, *Nature* 410, 259 (2001); F. H. Stillinger, *Science* 267, 1935 (1995)). Amorphous solids are usually prepared by cooling a liquid; however, accessing low energy states by this route is slow and impractical (M. D. Ediger, C. A. Angell, S. R. Nagel, *J. Phys. Chem.* 100, 13200 (1996); D. J. Plazek, J. H. Magill, *J. Chem. Phys.* 45, 3038 (1966)). This is because the molecular motion in a liquid that avoids crystallization as it is cooled eventually becomes too slow to allow the molecules to find equilibrium configurations. This transition to a non-equilibrium state defines the glass transition temperature $T_g$. Glasses are "stuck" in local minima on the potential energy-landscape (P. G. Debenedetti, F. H. Stillinger, *Nature* 410, 259 (2001); F. H. Stillinger, *Science* 267, 1935 (1995)). Because glasses arethermodynamically unstable, lower energies in the landscape are eventually achieved through molecular rearrangements. However, this process is so slow that it is generally impossible to reach states deep in the landscape by this route.

Although-vapor deposition has also been used to produce amorphous systems, it is commonly reported that vapor-deposition creates low density glasses with low kinetic and thermodynamic stability compared to liquid-cooled glasses (F. Faupel et al., *Rev. Mod. Phys.* 75, 237 (2003); K. Ishii, H. Nakayama, T. Okamura, M. Yamamoto, T. Hosokawa, *J. Phys. Chem. B* 107, 876 (2003); K. Takeda, O. Yamamuro, H. Suga, *J. Phys. Chem.* 99, 1602 (1995)). Thus, a need exists for amorphous solids with improved stability and methods for making the same.

SUMMARY OF THE INVENTION

The present invention provides vapor deposition methods for the preparation of amorphous solid materials with high density and extraordinary thermodynamic and kinetic stability. The methods may be used to form organic and inorganic glasses. The improvement in thermodynamic and kinetic stability may be attributed to enhanced mobility of the molecules within a few nanometers of the glass surface during deposition. The result is an efficient means of producing amorphous molecular solids that are low on the energy landscape and have a wide range of applications, including amorphous coatings for pharmaceuticals and advanced organic electronic devices.

The present stable amorphous solids are produced via vapor deposition of molecules onto a substrate under conditions that permit the molecules to retain mobility after deposition for a time sufficient to allow the deposited molecules to undergo structural relaxation before becoming part of the bulk amorphous material. It is believed that this enables the deposited molecules to access near-equilibrium configurations that would be inaccessible using more conventional vapor deposition protocols or liquid-cooling. The appropriate conditions are achieved by depositing the molecules at deposition-rates that are much lower (e.g., an order-magnitude lower) than the deposition rates conventionally employed in the vapor deposition of amorphous molecular solids and by depositing the molecules onto substrates held at temperatures that are considerably higher than the substrate temperatures conventionally employed in the vapor deposition of amorphous molecular solids. For example, the molecules may be deposited at rates of 15 nm per second (e.g., about 5 mg/(hr cm$^2$) for some molecules), or lower, and substrate temperatures of 0.8 to 0.9 $T_g$, where $T_g$ is the conventional glass transition temperature of the material from which the amorphous solid is made.

The present methods produce amorphous solids having stabilities that cannot be achieved using liquid-cooling methods. This is true regardless of the cooling rate used to produce the liquid-cooled solid because, although slower cooling rates provide more stable amorphous solids, the cooling-rates that would be required achieve stabilities equivalent to the present vapor-deposited solids are technologically inaccessible. Thus, while the present methods are able to provide layers of highly stable amorphous solids having a thickness of 10 nm or greater (e.g., about 10 nm to 100 µm) in a matter of hours, minutes, or even seconds, comparable liquid-cooling methods could take hundreds, thousands, or even tens of thousands of years to produce the same result. Obviously, the controlled cooling of a liquid over such time scales is not possible. Of course, the actual time required to deposit an amorphous solids will depend on both the rate of deposition and the desired thickness of the amorphous layer. The desired thickness of the amorphous layer will depend on the particular application in which the amorphous solid is to be used. The stability against crystallization of a drug made as an amorphous film or tablet may be improved by depositing onto its surface a thin layer, of the stabilized glass. The thickness of the deposited layer may only need to be a few nm (e.g., no greater than about 10 nm, e.g., about 2 to 5 nm) for substantial stabilization. Using the present methods, coatings of this thickness could be applied in seconds or minutes. For any application in, which an amorphous coating needs to be annealed to a low-energy state, the present methods may be advantageous because the deposited amorphous coating is already in a low-energy state, making additional annealing unnecessary. This is a significant advantage for applications such as pharmaceutical coatings where a thermal anneal could negatively affect the product.

The stability of the present vapor-deposited solids is reflected in several characteristics of the solids, including higher densities, higher onset temperatures for mobility, lower enthalpies, and lower water uptake relative to their liquid-cooled counterparts. However, the stability of the vapor-deposited, amorphous solids is perhaps best reflected in their low fictive temperatures. More specifically, the improved stability of the amorphous solids is reflected by the fact that a vapor-deposited amorphous solid made in accordance with the present methods will have a lower fictive temperature (based on enthalpy) than a liquid-cooled amorphous solid having, the same composition and cooled at any realistically accessible cooling rate.

For purposes of clarity, the comparison between the fictive temperatures of the present vapor-deposited amorphous solids and liquid-cooled amorphous solids having, the same composition should be understood as follows, the comparison is between a vapor-deposited solid and a liquid-cooled sample before the liquid-cooled sample has had time to "age" to a significantly lower energy (higher stability) state. This limitation is imposed on the comparison in recognition of the fact that an amorphous solid produced by liquid-cooling will naturally achieve lower energy (i.e., more stable) states over the course of time. Thus, a liquid-cooled sample could theoretically eventually achieve the same stability as a vapor-deposited solid made in accordance with the present invention. However, this natural process is so slow that it is effectively impossible for the liquid-cooled solid to, achieve the stability provided by the present vapor-deposited solids. Therefore, in order to avoid any indefiniteness regarding the appropriate comparison, the comparison is desirably between a vapor-deposited solid and a liquid-cooled solid that is the approximately the same age as, or younger than, the vapor-deposited solid. This avoids the hypothetical situation where the comparison is, between a vapor-deposited solid made in accordance with the present methods and a much older liquid-cooled solid that would have initially had a fictive temperature greater than that of the vapor-deposited solid, but that aged over the course of many years, decades or millennia to achieve a lower fictive temperature. Of course, in practice, the comparison could be made between a vapor-deposited solid and an older corresponding liquid-cooled sample, because the timeline for the liquid-cooled solid to achieve a significantly lower energy state is so long and the stability of the vapor-deposited solid is so high that that vapor-deposited solid will have a higher fictive temperature even when compared to a much older liquid-cooled solid.

In order to define the stability of the amorphous solids in more definite terms, a relatively simple test may be defined as follows: the vapor-deposited amorphous solids have a lower fictive temperature than a liquid-cooled amorphous solid formed by melting the vapor-deposited amorphous solid and cooling the resulting liquid at a rate of 1 K/min. In some instances, the vapor-deposited amorphous solid will have a fictive temperature that is at least 5K lower, at least 10 K lower, at least 20 K lower, or at least 30 K lower than that of a liquid-cooled amorphous solid having the same composition.

Although the present methods are generally applicable to the formation of any molecular glass, they are particularly well suited for use in the fabrication of glasses having high glass transition temperatures (e.g., ≧298K) such as those used in the pharmaceutical industry or glasses fabricated from pi-conjugated systems which are used in the electronic and optoelectronic industries.

Further objects, features, and advantages of the invention will be apparent from the following detailed description when taken in conjunction with the accompanying drawings.

DETAILED DESCRIPTION OF THE PREFERRED EMBODIMENTS

Figure 1A:
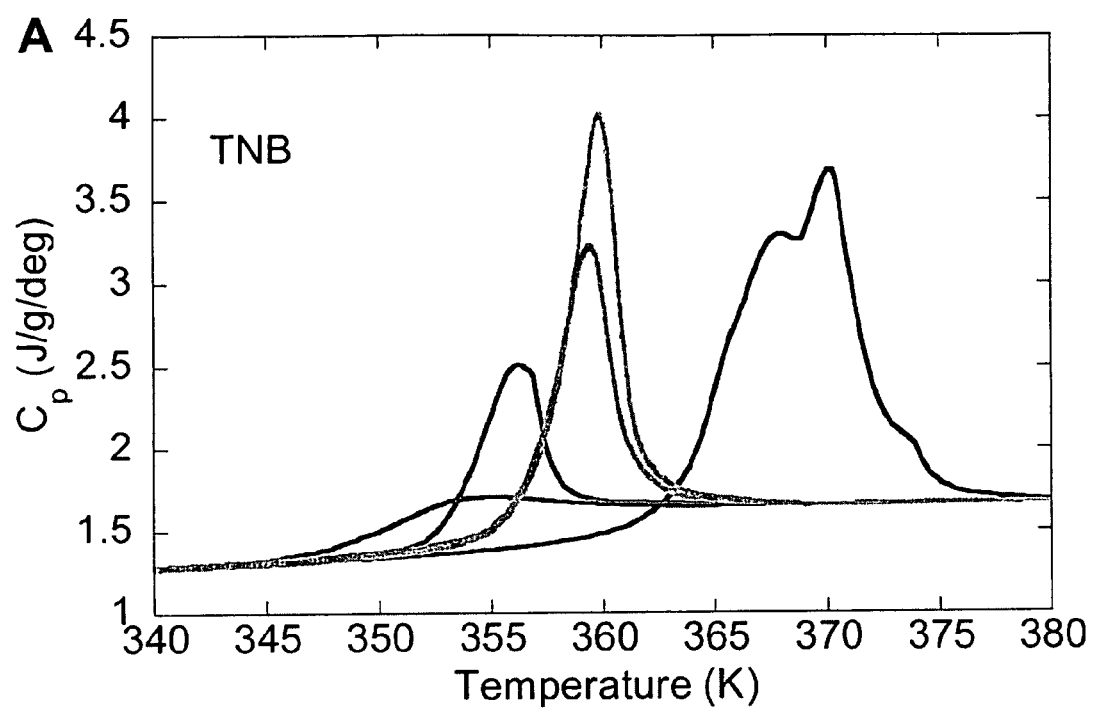
FIG. 1 shows (A) Heat capacity, $C_p$, of TNB samples: (i) vapor-deposited directly into a DSC pan at 296 K at a rate of ~5 nm/s (rightmost peak); (ii) ordinary glass produced by cooling the liquid at 40 K/min (leftmost peak); and (iii) ordinary glass annealed at 296 K for 174 days (second peak from left), 328 K for 9 days (third peak from left), and 328 K for 15 days (fourth peak from left). (Inset) Structure of TNB. (B) Enthalpy of 1,3-bis-(1-naphthyl)-5-(2-naphthyl)benzene ("TNB") and indomethacin ("IMC") samples. Heat capacities of the samples shown in (A) are integrated to obtain the curves shown for TNB.

The present invention provides vapor deposition methods that overcome the kinetic restrictions imposed by more conventional vapor deposition processes and liquid-cooling techniques to form amorphous solids with greatly enhanced stability. Using the present methods, deposition of molecules on a substrate is conducted under conditions (e.g., deposition rates and substrate temperatures) that permit the deposited molecules to remain mobile near the surface of the substrate for a period on the timescale of the structural relaxation time for the material before being buried, thereby allowing the molecules to approach their equilibrium configurations before they are frozen in the bulk material. In some embodiments the deposited molecules remain mobile for a significant fraction of one structural relaxation time ($\tau_\alpha$) (e.g., at least 25% or 50% of $\tau_\alpha$) in the mobile surface layer. The structural relaxation time of a low-molecular-weight liquid can be defined as the molecular reorientation time. In a bulk liquid, this can be measured as described in Richert et al., *J. Chem. Phys.* 118, 1828 (2003). This includes embodiments where the deposited molecules remain mobile for at least two structural relaxation times, at least three structural relaxation times, and at least five structural relaxation times.

The fictive temperatures of the amorphous solids provide one measure of the stability of the solids. Fictive temperature ($T_{fic}$) is the temperature where the equilibrium liquid has the same enthalpy as the glassy (i.e., amorphous) state. Thus, materials with lower $T_{fic}$ values have a lower energy (higher stability) on the energy landscape. $T_{fic}$ may be measured by measuring the enthalpy of a material as a function of temperature and determining where the resulting enthalpy curve intersects the supercooled liquid enthalpy curve for the material. (For the purposes of this disclosure, the extrapolated supercooled liquid enthalpy curve is calculated by determining the temperature dependence of the enthalpy between the glass transition and the melting point and extrapolating this dependence to lower temperatures.) Vapor-deposited amorphous solids made in accordance with the present methods have lower $T_{fic}$ values than amorphous solids of the same compositions made by more conventional vapor-deposition methods or liquid-cooling techniques.

The Kauzmann temperature is another reference point for the stability of the present amorphous solids. The Kauzmann temperature ($T_K$) is the temperature at which the extrapolated entropy of the supercooled liquid equals that of the crystal, as described and defined in Kauzmann et al., *Chem. Rev.* 43, 219 (1948). A figure of merit based on $T_K$ may be defined as follows:

$$\theta_K = \frac{T_g - T_{fic}}{T_g - T_K}, \quad (1)$$

where $T_g$ is the glass transition temperature measured at 10 K/min. and $T_{fic}$ is the fictive temperature. For fragile liquids, $\theta_K$ is a measure of position on the energy landscape with a value of 1 ($T_{fic}=T_K$) indicating the lowest possible position. 0 on the landscape. In some instances, the present stable, amorphous, solids have $\theta_K$ values, of at least 0.2, at least 0.3 or even at least 0.4. In such instances the value of $\theta_K$ for the present solids may be at least twice or three times that of a liquid-cooled solid having the same composition.

The present vapor-deposited solids are also unusually dense. In some instances, the present vapor-deposited solids have densities at least 0.5% higher, at least 1% higher, or even at least 1.5% higher than liquid-cooled solids of the same composition. Methods for determining the densities of the vapor-deposited, solids relative to liquid-cooled solids are described in detail in the Example section, immediately below.

The examples that follow illustrate the invention using 1,3-bis-(1-naphthyl)-5-(2-naphthyl)benzene (TNB, $T_g$=347 K) and indomethacin (IMC, $T_g$=315 K) as examples. These two molecular glass formers are used by way of illustration only.

Additional descriptions of methods of making and characterizing unusually stable IMC in accordance with the present invention is provided in Kearns et al., *J. Chem. Phys.* 127, 154702-1 (2007), and in Swallen et al., *Science,* 315, 353 (2007), the entire disclosures of which are incorporated herein by reference.

EXAMPLES

Example 1

Unusually Stable TNB and IMC Glasses

Materials 1,3-bis-(1-naphthyl)-5-(2-naphthyl)benzene (also referred to as $\alpha\alpha\beta$-tris-naphthylbenzene, tris(naphthylbenzene), or TNB, along with its partially deuterium substituted analog, were synthesized using procedures analogous to those described previously (C. M. Whitaker, R. J. McMahon, *J. Phys. Chem.* 100, 1081 (1996)). (Note that the literature prior to 1996 contains several papers characterizing a substance identified as 1,3,5-tri-$\alpha$-naphthylbenzene. Whitaker and McMahon established that these earlier studies were almost certainly performed on $\alpha\alpha\beta$-d TNB (C. M. Whitaker, R. J. McMahon, *J. Phys. Chem.* 100, 1081 (1996)).) Indomethacin ("IMC") was purchased commercially (Aldrich), and used without further purification. IMC is hygroscopic, and care Was taken to maintain sample dryness.

Vapor Deposition

Physical vapor deposition was used to create glasses of IMC, and of h-TNB and d-TNB. Samples were prepared by deposition onto a silicon wafer or differential scanning calorimetry ("DSC") pan at a controlled temperature. The substrate temperature was held constant during deposition using a Lakeshore 340 controller with platinum resistance temperature detector ("RTD") sensors. Deposition rates varied from 0.1 to 5 nm/s. Deposition occurred from crystalline material in a heated crucible located 3-30 cm from the substrates. The background pressure in the chamber was $<10^{-7}$ torr.

The purities of vapor-deposited IMC and TNB films were assessed by DSC for samples directly-deposited into DSC pans. For IMC films, two distinct melting point temperatures (424.5±1 K and 431.9±1 K) were observed corresponding to the $\alpha$ and $\gamma$ polymorphs, respectively. Analysis of TNB films resulted in a melting point temperature of 468.6±1 K. The measured melting points are consistent with previously reported values (C. M. Whitaker, R. J. McMahon, *J. Phys. Chem.* 100, 1081 (1996)). Comparison of vapor-deposited films to samples that were directly weighed into DSC pans resulted in melting points that were independent of preparation method (within 1.5 K).

Vapor-deposited TNB and IMC glasses were at least 99% amorphous, as judged by their transparent visual appearance. Samples left at room temperature for months developed white crystalline spots which grew slowly with time. Other indications of the amorphous nature of the vapor-deposited films include: 1) density decreasing upon annealing above $T_g$ (see FIG. 2); 2) diffusion occurring after the long induction time shown in FIG. 4B; and 3) large enthalpy relaxation signal near the conventional $T_g$, shown in FIG. 1A. Preliminary wide-angle x-ray scattering of vapor deposited IMC films showed no indication of the sharp lines that are indicative of crystalline IMC.

Glass Stability Measurements

Differential scanning calorimetry (DSC) was used to examine the kinetics and thermodynamics of vapor-deposited samples created by heating crystalline TNB or IMC in a vacuum. To move a sample from the glass to the supercooled liquid, energy must be supplied to the sample. In DSC, this energy is supplied as heat to the system as the temperature is ramped from a temperature below the glass transition into the supercooled liquid regime. For an ordinary glass that is cooled from the melt the amount of energy needed to do this is observed by a change in heat capacity at $T_g$. Samples that are more stable than ordinary glass require more energy to move the system from the glassy state. An endothermic heat characteristic will be observed in these cases, often referred to as an enthalpy overshoot, where the size and temperature of the overshoot indicate the amount of stability.

FIG. 1A shows DSC data for TNB that was vapor-deposited onto a substrate held at 296 K (rightmost curve). This scan was continued to above the melting point, after which the sample was cooled at 40 K/min into the glass and then scanned again to yield the leftmost curve. This latter-curve represents the behavior of an ordinary glass of TNB, with $T_g$=347 K, as defined by the onset temperature; it is consistent with previously reported results for TNB (C. M. Whitaker, R. J. McMahon *J. Phys. Chem.* 100, 1081 (1996); J. H. Magill, *J. Chem. Phys.* 47, 2802 (1967)). The DSC instrument was calibrated using an indium standard.

Remarkably, the vapor-deposited sample had a significantly higher onset temperature of 363 K. This result indicates that the vapor-deposited material is kinetically much more stable, because higher temperatures are required to dislodge the molecules from their glassy configurations. For comparison, the ordinary glass was isothermally annealed for 6 months at 296 K and up to 15 days at 328 K (equilibrium was reached at 328 K). The vapor-deposited samples created in only a few hours had much greater kinetic stability than the ordinary glasses aged for many days or months below $T_g$.

Figure 1B:
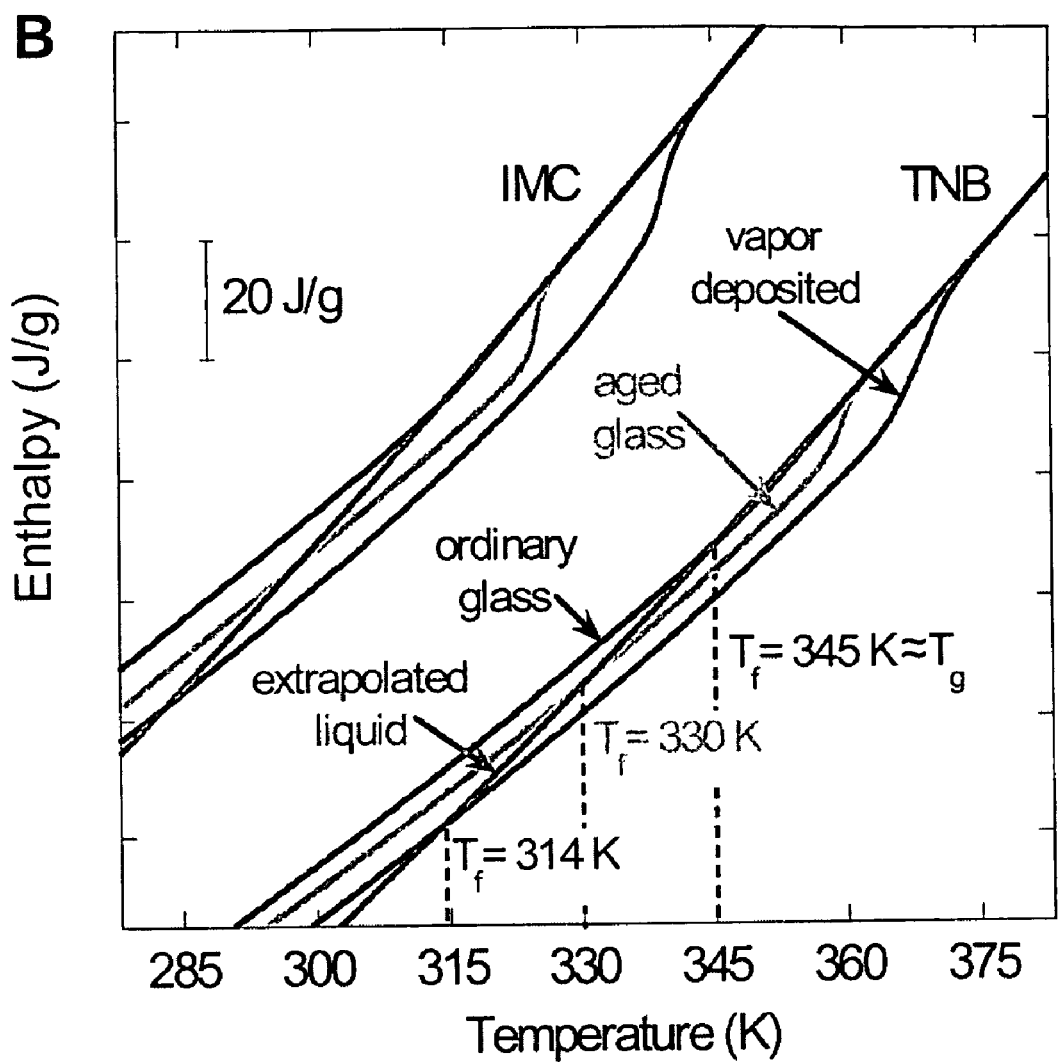

The fictive-temperature ($T_{fic}$) of the glasses, as defined below, was calculated in order to quantify the thermodynamic stability of the vapor-deposited materials. Lower $T_{fic}$ values indicate a lower position on the energy landscape. The enthalpy for TNB and IMC samples, obtained by integrating $C_p$, is plotted in FIG. 1B. (Heat capacity measurements were done on a TA Instruments Q1000 differential scanning calorimeter. Each curve in FIG. 1A was obtained by heating ~3 mg of material in a sealed aluminum pan at 10 K/min.) The intersection between these data and the extrapolated, supercooled liquid enthalpy defines $T_{fic}$ for each sample. The supercooled liquid enthalpy curve was calculated by determining the temperature dependence of the enthalpy between the glass transition and the melting point and extrapolating this dependence to lower temperatures. For both TNB and IMC, samples prepared by vapor deposition had considerably lower enthalpies and $T_{fic}$ values. Based upon aging experiments on TNB (D. J. Plazek, J. H. Magill, *J. Chem. Phys.* 45, 3038 (1966)), it is estimated that it would require at least 40 years of annealing an ordinary glass to match $T_{fic}$ for the vapor-deposited sample shown in FIG. 1.

The Kauzmann temperature and $\theta_K$ were also calculated. For TNB, Magill estimated $T_K$=270 K (J. H. Magill, *J. Chem. Phys.* 47, 2802 (1967)). Vapor deposition of TNB at 296 K (i.e., $0.85T_g$) created films with $\theta_K$=0.43; by this measure the material has proceeded 43% toward the bottom of the energy landscape for amorphous configurations. In comparison, annealing the ordinary glass at 296 K ($\theta_K$=0.09) or 328 K ($\theta_K$=0.22) is relatively ineffective. Similar results were observed for IMC deposited at $0.84T_g$, with $\theta_K$=0.23 to 0.44, depending on deposition rate. These results can be put into context by comparison with Kovac's seminal aging experiments on poly(vinylacetate), where 2 months. Of annealing achieved $\theta_K$≦0.17 (A. J. Kovacs, *Fortschr Hochpolym-Forsch.* 3, 394 (1963)).

Density of TNB Glass

Figure 2:
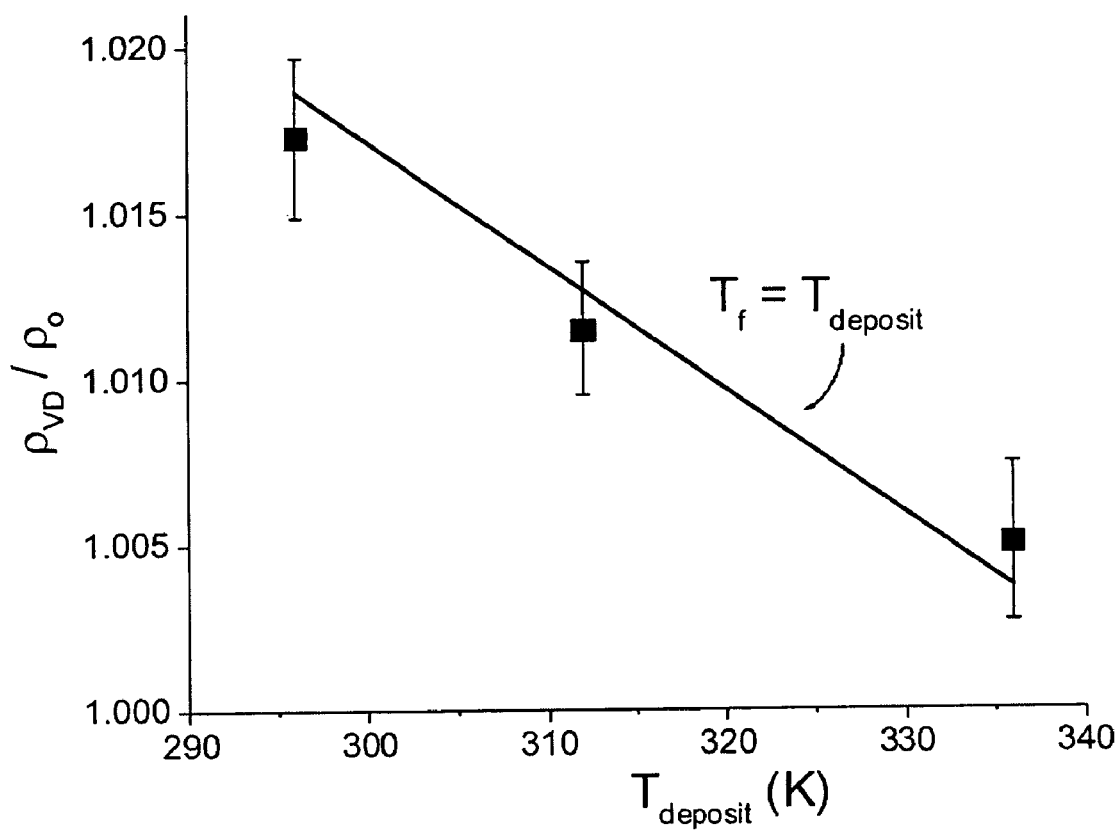
FIG. 2 shows the density of vapor-deposited TNB films ($\rho_{VD}$) normalized to the density of the ordinary glass ($\rho_o$), with both measured at room temperature. Experimental density ratios (■) were calculated from x-ray reflectivity measurements on 100-300 nm films by measuring film thickness before and after annealing above $T_g$. The solid line indicates the expected density, if the samples were prepared in the supercooled liquid state, with $T_f = T_{deposited}$.

The present vapor-deposition methods can also create unusually dense glasses. The ratio of the density of vapor-deposited TNB ($\rho_{VD}$) to that of the ordinary glass ($\rho_o$, prepared by cooling from the liquid), increases as the deposition temperature is lowered toward $0.85 T_g$ (FIG. 2). Also shown as the solid line is a prediction of the density if vapor-deposition produced an equilibrium supercooled liquid at the deposition temperature (D. J. Plazek, J. H. Magill, *J. Chem. Phys.* 45, 3038 (1966)). For this range of deposition temperatures, the samples nearly achieve this upper bound for density. If a fictive temperature is defined based upon density, deposition at 296 K produces $T_{fic}$≈300 K, slightly lower than the fictive temperature based upon the enthalpy. Fictive temperatures based on densities can be determined from FIG. 2, by horizontally shifting the points to overlap with the line shown.

The data in FIG. 2 were determined from x-ray reflectivity measurements made on as-prepared films of TNB and on the same films after thermal equilibration above $T_g$. All x-ray data was taken at room temperature. Fits to this data provided direct measurements of film thickness. Since the area of the film was the same before and after annealing, the ratio of the densities equals the inverse of the ratio of the thicknesses, and this is reported in FIG. 2.

The solid line in FIG. 2 indicates the predicted value of $\rho_{VD}/\rho_o$ in the hypothetical situation where vapor deposition-produces an equilibrium liquid at the deposition temperature. Magill and Plazek; *J. Chem. Phys.* 45 3038 (1966), report the liquid density at higher temperatures, and this was extrapolated to obtain $\rho_{VD}$. In order to plot the line in FIG. 2, an absolute value for the density of the liquid-cooled material ($\rho_o$) is needed. We assume that our samples have the equilibrium liquid density after extensive annealing above $T_g$. Thus, the equilibrium liquid density at 346 K and the glassy thermal expansion coefficient reported by Magill and Plazek were used to calculate $\rho_o$. In this last step, it was assumed that samples cooled quickly on a silicon substrate had the same densities as those obtained by quickly cooling a bulk liquid. The former process produced a slightly anisotropic glass (due to the thermal expansion mismatch between Si and TNB); however, this should have a small effect on the density.

Diffusion in TNB Glasses

Neutron reflectivity was used to characterize diffusion in ordinary and stable glasses of TNB. The high spatial resolution and large contrast in the scattering length of neutrons for hydrogen and deuterium nuclei make this an excellent technique for quantifying molecular motion. The neutron reflectivity experiments were conducted at the NIST Center for Neutron Research at the National Institute of Standards and Technology (NCNR-NIST). The NG7 horizontal reflectometer utilized a 4.76 Å collimated neutron beam, with a wavelength divergence of 0.18 Å. The angular divergence of the beam was varied through the reflectivity scan and this provided a relative q resolution $\Delta q/q$=0.04 ($q=4\pi \sin \theta/\lambda$, where $\theta$ is the incident and final angle with respect to the surface of the film, and where $\lambda$ is the neutron wavelength).

For the neutron reflectivity measurements, multilayer thin films of protio TNB (h-TNB) and deuterio TNB (d-TNB)

were deposited onto 76-mm-diameter, 3-mm-thick silicon-wafers (Wafer World and Virginia Semiconductor), as described in S. F. Swallen, et al., *J. Chem. Phys.* 124, 184501 (2006). The silicon was used as received, retaining the native oxide coating. The deposition rate was typically 0.1 nm/s. Prior to deposition, the substrate was spin-coated with a 10-nm polystyrene layer (Polymer Source, ~$10^6$ g/mol), which acted to minimize crystallization and dewetting of the TNB film during annealing. The polystyrene was made from a mixture of protio and perdeuterio chains, in order to approximately match the neutron scattering length density of the first h-TNB layer. Following deposition, the samples were slowly cooled and held at room temperature for 1 to 5 days before neutron reflectivity measurements were obtained. The specular reflectivity R was measured as a function of beam angle relative to the sample surface. This value, multiplied by $q^4$ for clarity, is plotted as a function of the wavevector q. Reflectivity curves for samples vapor-deposited at different temperatures display diffraction peaks; as expected for the symmetric multi-layer samples, only odd diffraction orders are, present. For samples deposited at low temperature, diffraction can be observed up to the $13^{th}$ order, indicating very sharp h-TNB/d-TNB interfaces. (S. F. Swallen et al; *Science* 315, 353 (2.007)).

Figure 3:
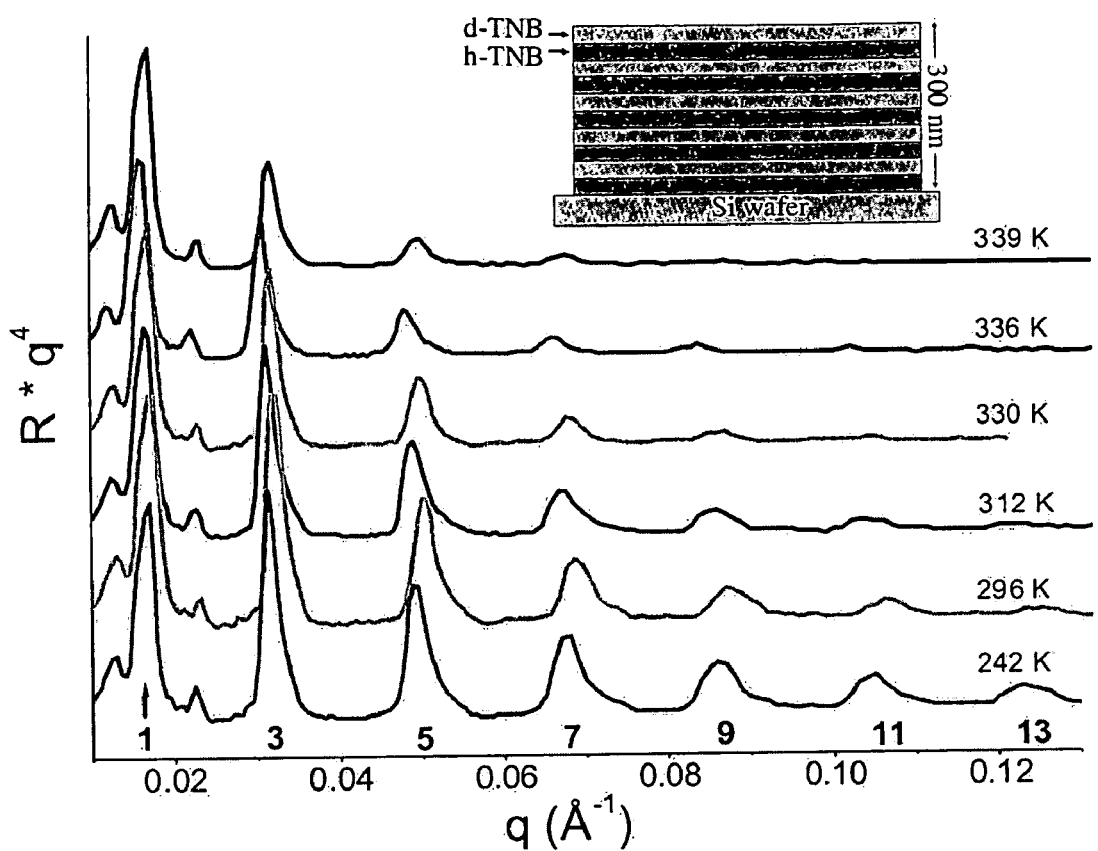
FIG. 3 shows neutron reflectivity versus wave-vector q for multilayer TNB films vapor-deposited at the specified temperatures. The peak-intensities are determined by the sharpness of the h-TNB/d-TNB interfaces, which vary from 1.5 to 9 nm (full width at half maximum of the concentration profile derivative). The diffraction order of each peak is given by the numbers at the bottom. The inset illustrates the structure of the vapor-deposited sample.

FIG. 3 shows neutron reflectivity data for as-deposited samples prepared by vapor deposition at a range of substrate temperatures. These, data were measured at room temperature. The amplitude of the peaks is governed by the sharpness of the interfaces, while the position in q-space is determined by the length scale being probed: $q=2\pi/\lambda$. The fundamental wavelength is equal to the thickness of the repeating element; in this case a single, 60-nm-thick h-TNB/d-TNB bilayer, while the higher harmonics probe the structural order on progressively shorter length scales. The first and third harmonics are shifted to slightly higher q values than would be anticipated based upon the equation above, due to the presence of the critical edge of the silicon substrate at $q\approx 0.01$ Å$^{-1}$ (S. F. Swallen et al., *J. Chem. Phys.* 124, 184501 (2006)).

Figure 4:
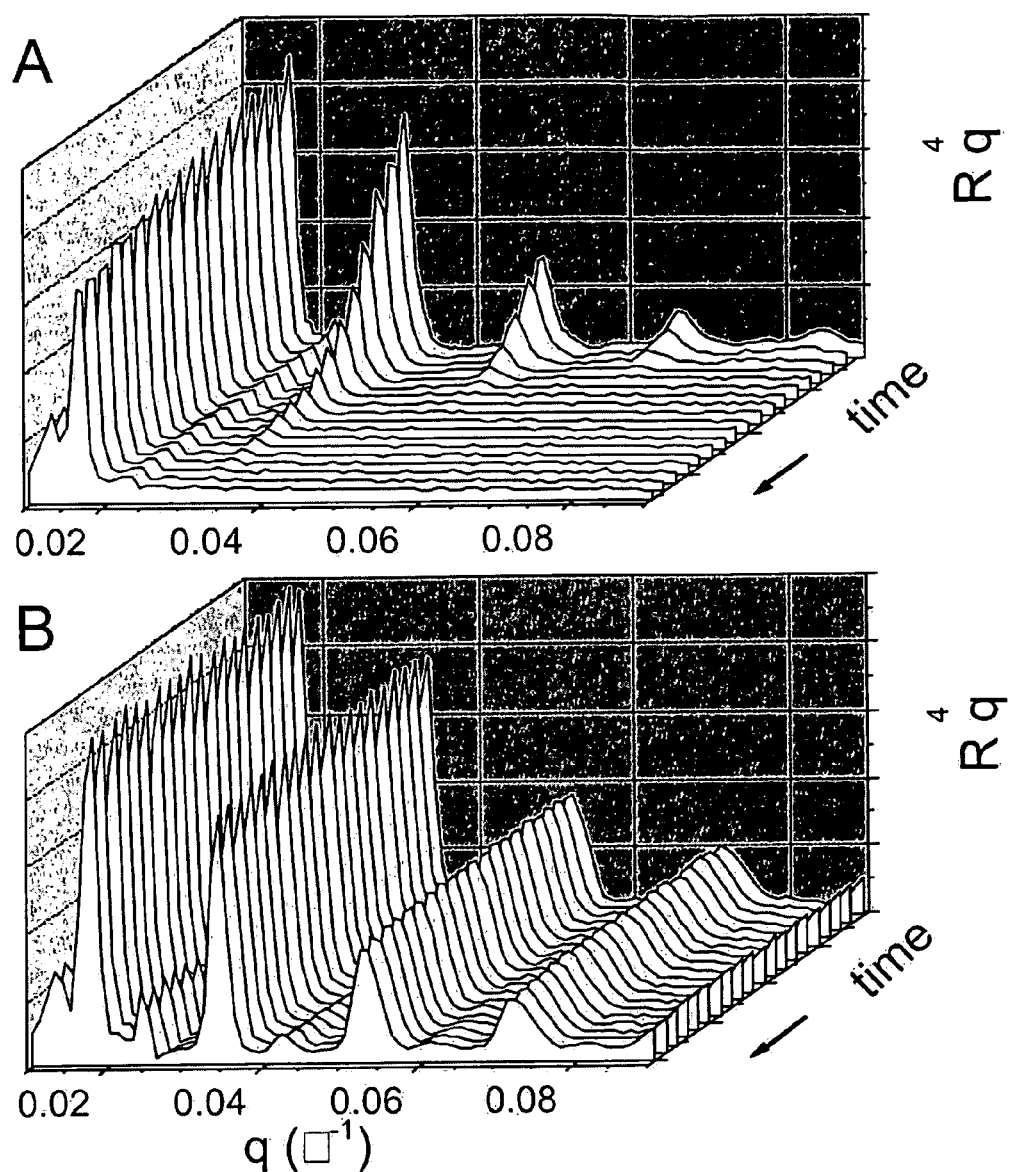
FIG. 4 shows neutron reflectivity data for TNB multilayer films continuously annealed at 342 K. The substrate temperature during vapor deposition was (A) 330 K, and (B) 296 K. The decay of the harmonic peaks in (A) occurs over 8 hours and is caused by bulk molecular diffusion. No detectable diffusion occurs in (B) over 16 hours.

FIG. 4 shows a time series of neutron reflectivity curves obtained for two vapor-deposited samples during, annealing in an in-line oven at 342 K, for samples deposited at 330 K (FIG. 4A) or 296 K (FIG. 4B). The temperature was held constant to within ±0.1 K during the annealing process, which ranged up to 30 hours. Scans were made over a q range from 0.01 Å$^{-1}$ to a maximum of 0.13 Å$^{-1}$, with a typical duration of 30 minutes per scan. An analysis software package called Reflfit, provided by NIST, was used to analyze the neutron reflectivity data. During 8 hours of annealing, all diffraction peaks (except the first order peak) for sample A decayed to zero, indicating that substantial interfacial broadening had occurred because of interdiffusion of h-TNB/d-TNB. During the 16 hours of annealing at 342 K for sample B, no detectable interdiffusion occurred, even on the single-nanometer-length scale. The only difference between these two samples was the temperature at which the substrate was held during deposition.

FIG. 4A illustrates the behavior of an ordinary glass annealed near $T_g$; as shown elsewhere (S. F. Swallen et al., *J. Chem. Phys.* 124, 184501 (2006)), interdiffusion in this sample is characteristic of the equilibrium liquid. In contrast, the sample deposited near $0.85T_g$ (FIG. 4B) is kinetically much more stable, in qualitative agreement with the high onset temperature shown for the vapor-deposited sample in FIG. 1A. The magnitude of this stability can be quantified in terms of the equilibrium structural relaxation time $\tau_\alpha$, known to be 250 s at 342 K (R. Richert, K. Duvvuri, L.-T. Duong, *J. Chem. Phys.* 118, 1828 (2003)). The induction time for the sample deposited at $0.85T_g$ exceeds 200 $\tau_\alpha$.

The reflectivity curves in FIG. 3 provide insight into the mechanism that allows vapor-deposition to create unusually stable glasses. The average h-TNB/d-TNB interface widths of the as-deposited samples were extracted from fits to the raw data (S. F. Swallen et al., *J. Chem. Phys.* 124, 184501 (2006)), and ranged from 9 nm for the sample deposited at 339 K to 1.5 nm for deposition at 242 K. For all samples deposited at 296 K or above, the interfacial width exceeds the surface roughness (~1.5 nm), as determined by x-ray and neutron reflectivity, and the broadening estimated for bulk diffusion during the deposition process (S. F. Swallen. et. al., *J. Chem. Phys.* 124, 184501 (2006)). Deposition at 242 K ($0.7T_g$) produced interfacial widths that are consistent with the surface roughness.

Because the h-TNB/d-TNB interface widths for deposition temperatures above 242 K cannot be explained by surface roughness or bulk diffusion, they may be attributed to enhanced mobility within a few nanometers of the surface of a TNB glass. Such mobility would explain both the broad interfaces observed in the as-deposited samples and the unusually stable glasses formed by vapor-deposition. At the deposition rates used in these experiments (0.1-5 nm/s), TNB molecules would be a part of the mobile surface layer for ~1 s before they are buried and become part of the bulk glass. If molecules at the surface can substantially rearrange in 1 s, they can find configurations that are near equilibrium configurations at the temperature of the substrate, even if the substrate is well below $T_g$.

This rapid configuration sampling at the surface, in a layer-by-layer fashion, produced a bulk glass that is low in the energy landscape with unusually high density and kinetic stability. It also produced the broad interfaces observed for deposition at temperatures of 296 K and above.

The surface-mobility mechanism for the creation of unusually stable glasses is supported by an order-of-magnitude calculation. TNB samples vapor-deposited at 296 K have interface widths of 2.5 nm, clearly in excess of the widths associated with surface roughness. The additional 1 nm of interface width is attributed to surface mobility, and given a deposition rate of 0.1 nm/sec, the molecules were within the mobile surface layer for 10 s. Combining this length and time yields an estimate for the surface diffusion coefficient of $5\times 10^{-16}$ cm$^2$/sec. For bulk TNB, this diffusion coefficient is found near $T_g$, where the structural relaxation time $\tau_\alpha$ is a few seconds (S. F. Swallen et al., *J. Chem. Phys.* 124, 184501 (2006); R. Richert, K. Duvvuri, L.-T. Duong, *J. Chem. Phys.* 118, 1828 (2003)). Thus, surface-molecules may remain mobile for several structural, relaxation times before becoming buried, long enough to find near-equilibrium configurations at 296 K.

Figure 5:
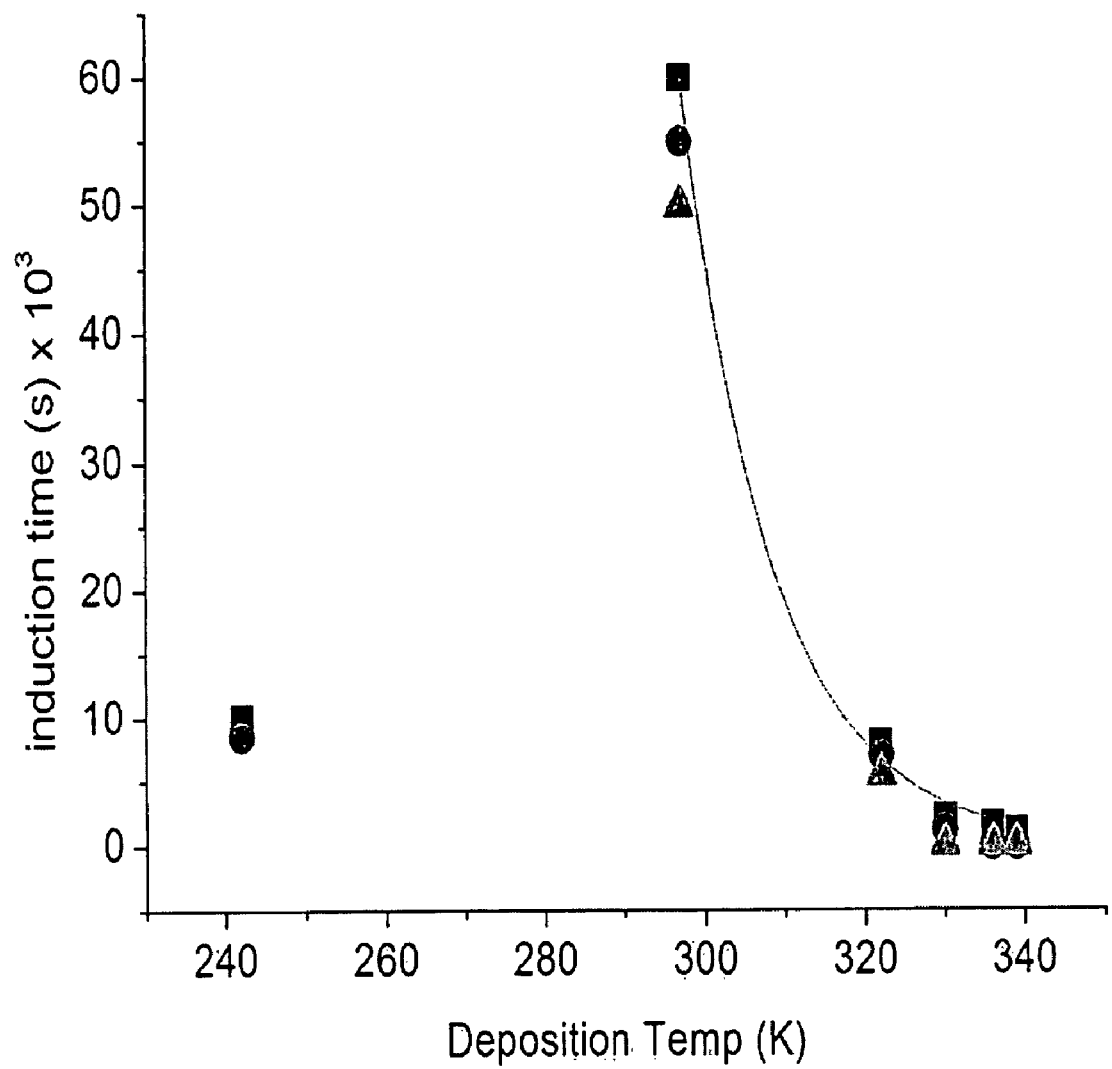
FIG. 5 shows neutron reflectivity measurements of time delay before molecular diffusion begins to occur during annealing of TNB glass.

FIG. 5 shows neutron reflectivity measurements of time delay before molecular diffusion begins to occur during annealing of TNB glass. This induction time is plotted for samples vapor-deposited at temperatures between Tg and 0.71Tg, when each is annealed at Tg. A peak is observed at 0.85Tg, indicating sample preparation temperature which produces maximally stable glasses. The symbols are measurements of the third (square), fifth (circle) and seventh (triangle) harmonics measured in the neutron reflectivity measurement. These correspond to the degree of structural order in the sample on the 21 nm, 13 nm, and 8 nm length scales, respectively. Thus as shown in FIG. 5, no molecular motion is seen in samples deposited at Tg−50 K for many hours, even on the single nanometer length scale.

Heat Capacity of IMC Glass

Figure 6:
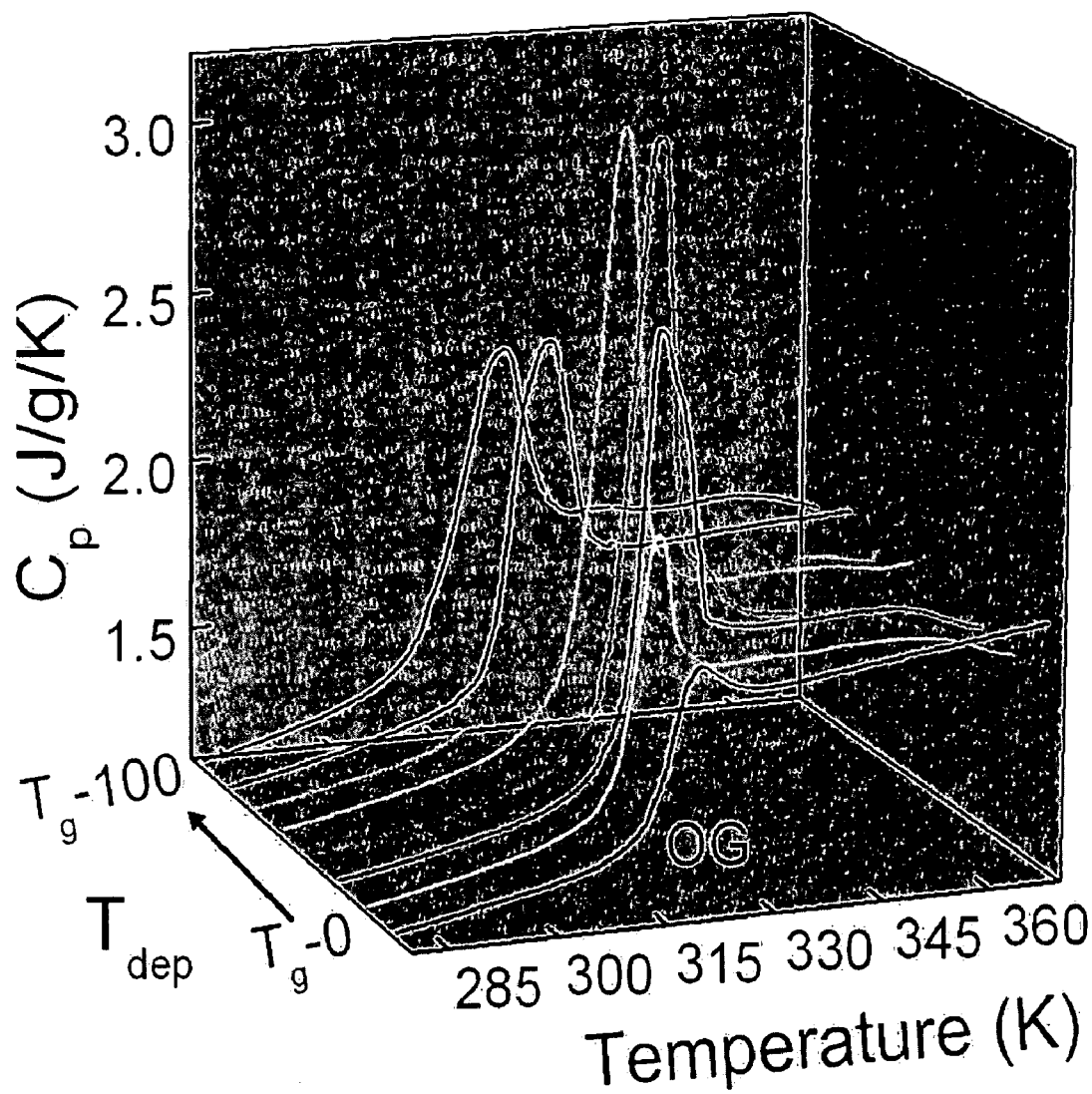
FIG. 6 shows the heat capacity of IMC films deposited onto substrates that were held isothermally at various temperatures during the deposition. $1^{st}$ Curve (i.e., closest curve): ordinary glass; $2^{nd}$ curve: $T_{dep}$=315 K; $3^{rd}$ curve: $T_{dep}$=295 K; $4^{th}$ curve: $T_{dep}$=275 K; $5^{th}$ curve: $T_{dep}$=265 K; $6^{th}$ curve: $T_{dep}$=255 K; $7^{th}$ curve: $T_{dep}$=240 K; $8^{th}$ curve: $T_{dep}$=215 K.

FIG. 6 shows the heat capacity of IMC films deposited onto substrates that were held isothermally at various temperatures during the deposition. As the temperature of the substrate is progressively lowered with respect to $T_g$, the stability of the sample increases, as indicated by the larger overshoot. At deposition temperatures ($T_{dep}$) around 50 degrees below the glass transition, the largest overshoots are observed, indicating the greatest stability. Further decreasing the temperature of the substrate decreases the overshoot.

It should be noted that at the lowest deposition temperatures, the amount of stability observed does not approach or become less than that of the ordinary glass. As mentioned above, at low $T_{dep}$, films are expected are to be less stable than ordinary glass. This phenomenon may not be achieved due to the small amount of time the sample spends at 295 K while being transferred from the deposition chamber to the DSC for analysis. If the samples were unstable, relaxation would quickly occur due to aging at 295 K.

Kinetic Stability of IMC Glass

The present unusually stable glasses can show both thermodynamic and kinetic stability. DSC can be used to characterize this kinetic stability. When a glass is heated through $T_g$, at some temperature the glass will begin to absorb extra heat as it transforms into a supercooled liquid. The temperature of this transition is referred to as the onset temperature, $T_{onset}$. If $T_{onset}$ were pushed to higher temperatures, this would indicate that the particular glass has greater kinetic stability.

Figure 7:
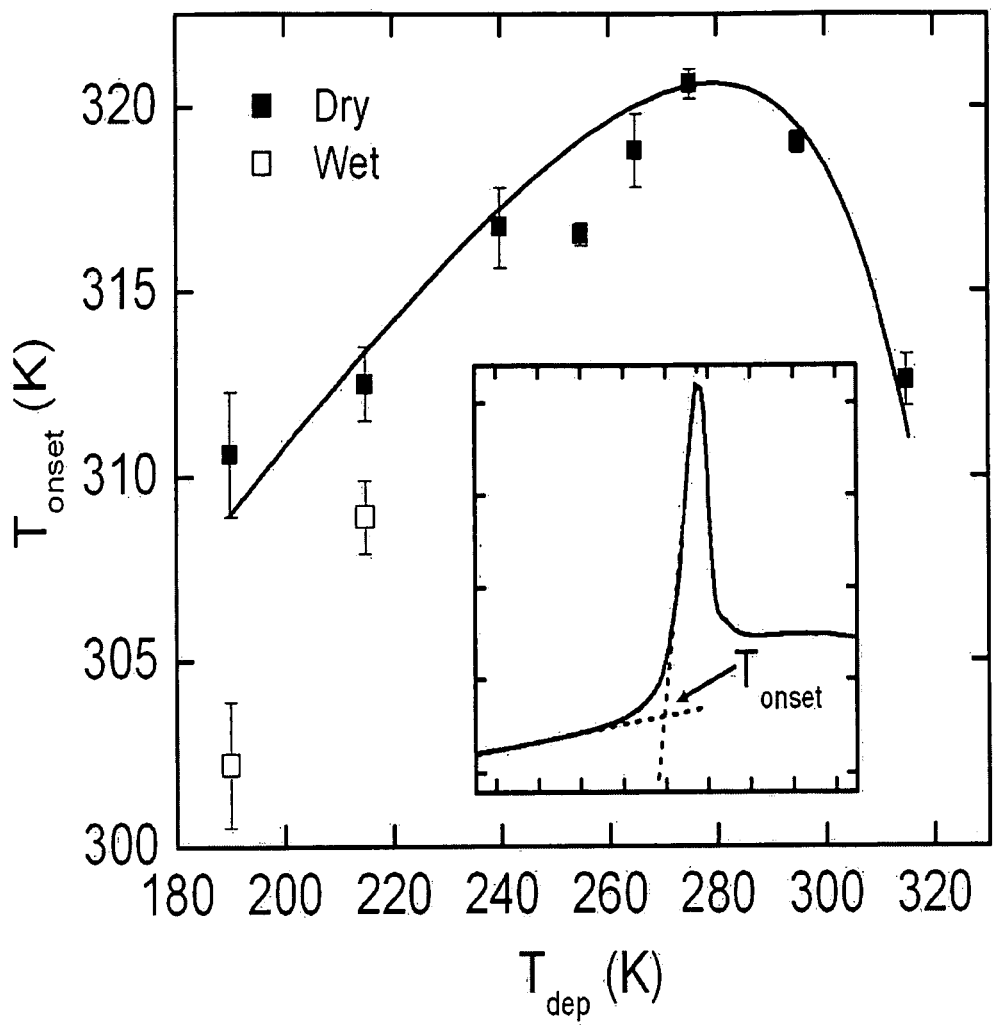
FIG. 7 shows $T_{onset}$ for the IMC glass for a Wide range of $T_{dep}$.

The inset of FIG. 7 shows how $T_{onset}$ is defined from a typical DSC scan. The linear glassy region of the $C_p$ is extrapolated to higher temperatures using a linear fit of the glass from 280 K to 300 K. The sharp increase in $C_p$ is also fit linearly. A line is extrapolated to lower temperature which was fit from 1.7 J/g/K to 95% of the overshoot peak height. The intersection of the linearly extrapolated glass line and enthalpy overshoot defines $T_{onset}$ from the DSC data. It should be noted that by this definition, $T_{onset}$ for an ordinary glass is equal to $T_g$.

FIG. 7 shows $T_{onset}$ for the IMC glass for a wide range of $T_{dep}$. At temperatures near $T_g$, the onset temperature that is observed is nearly that of the ordinary glass. As $T_{dep}$ is lowered, the onset temperatures become greater, reaching a maximum near 275 K to 265 K. Using the interpretation described above, this would indicate that glasses deposited around $0.85T_g$ are the most stable. Lowering $T_{dep}$ further decreases the kinetic stability of the films.

Figure 8:
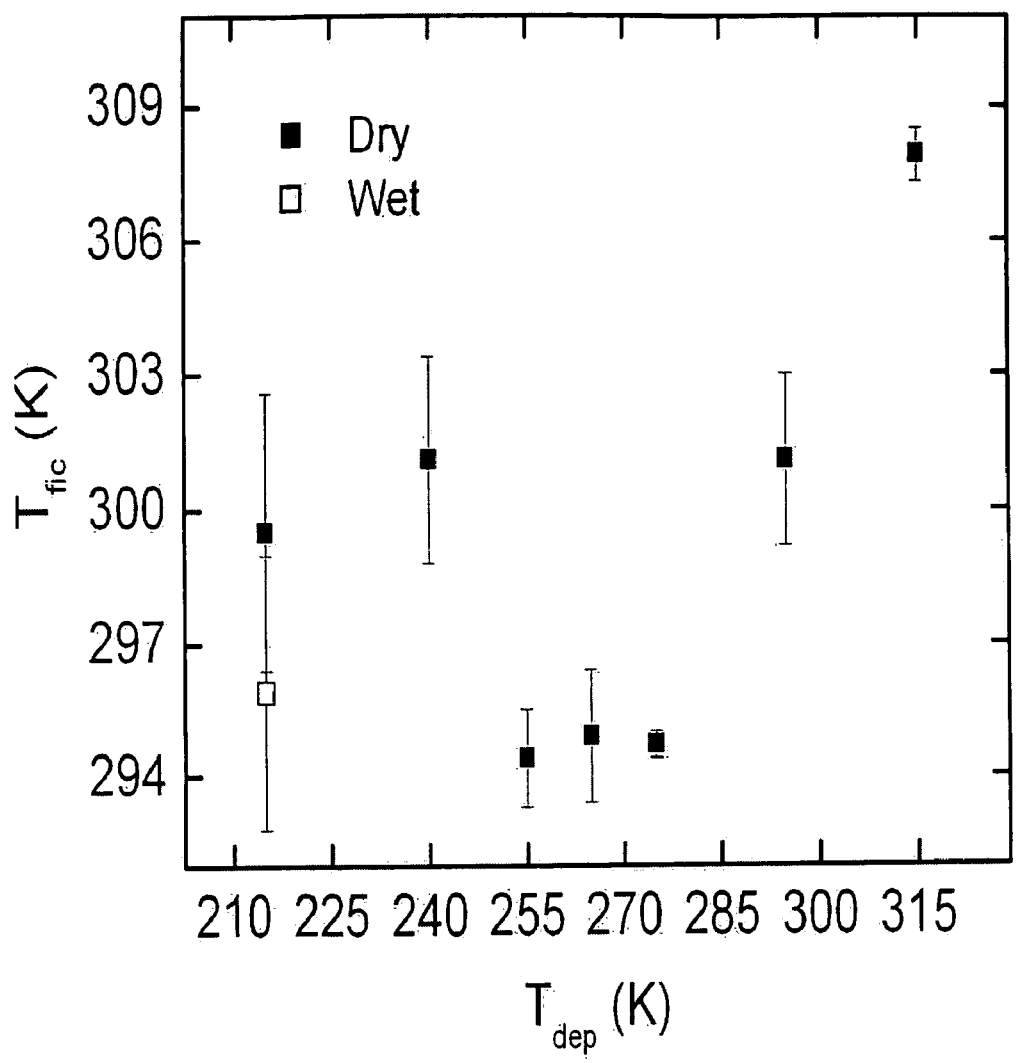
FIG. 8 shows the correction to the shift in $T_{onset}$ for IMC glass due to water absorption.

For IMC, $T_{dep}$ of 215 K and lower results in films having a measurable amount of water. Since, amorphous IMC is slightly hygroscopic, water can be adsorbed during the transfer of the pans from the vacuum chamber until, they are hermetically sealed. If water has been adsorbed, it will be observed as shifts in $T_m$ of the second scan and $T_g$ of the third scan. The shift of $T_g$ in the third scan to lower temperatures can be quantified and used to correct for the shift in onset temperature due to water. For instance, if $T_g$ in the third DSC scan is shifted to lower temperatures by 5 K, then, $T_{onset}$ for that sample will be shifted 5 K higher. These corrected samples are referred to as the "dry" samples in FIG. 8. The assumption is that the water will affect both the first and third scans equally, and any broadening of the transition will be minimal.

Figure 9:
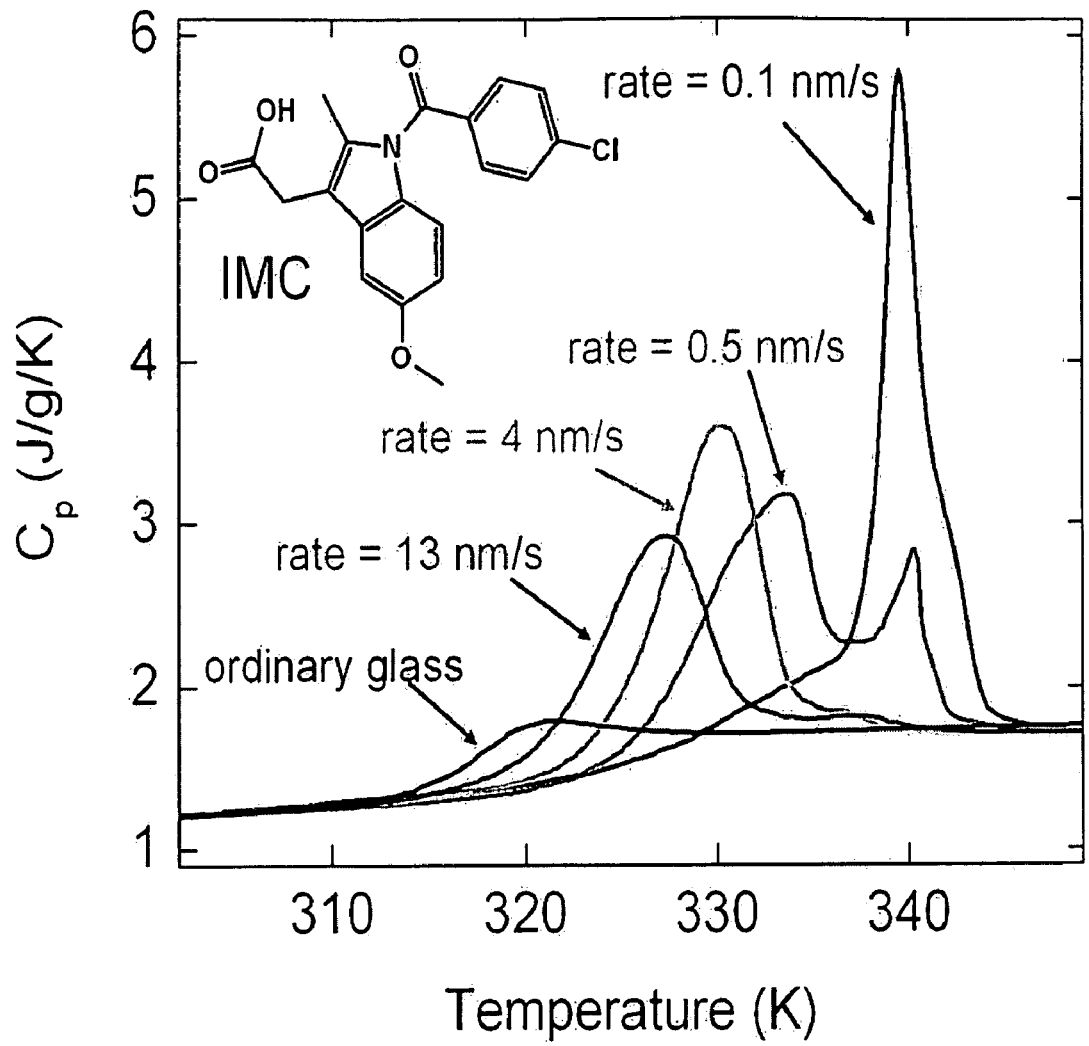
FIG. 9 shows $C_p$ measurements for IMC deposited at 265 K into DSC pans at various rates of deposition.

FIG. 9 shows Cp measurements for IMC deposited at 265 K into DSC pans at various rates of deposition. As the rate of deposition is lowered, the kinetic as well as the thermodynamic stability increases. This behavior is qualitatively consistent with a mechanism with enhanced mobility at the surface of the depositing film. At the lowest deposition rates, molecules are given much more time on the surface to equilibrate before being buried by subsequently deposited material.

As compared to many reported depositions of metallic and organic materials, the present methods use lower deposition rates and/or substrate temperatures that are nearer to $T_g$. The result is the creation of highly stable glasses.

Example 2

Reduced Water Uptake by Unusually Stable Glasses

This example demonstrates the reduced water uptake that is characteristic of stable glasses made in accordance with the present methods. The stable glass was prepared by vapor depositing IMC onto an aluminum substrate using the method described in Example 1, above. The substrate was held at a temperature of 265 K and a deposition rate of 2 Å/s was used. For comparison, two "ordinary" glass samples were also prepared. These were formed by vapor-deposition at 315 K. In addition, water uptake was measured for a crystalline IMC glass.

Figure 10:
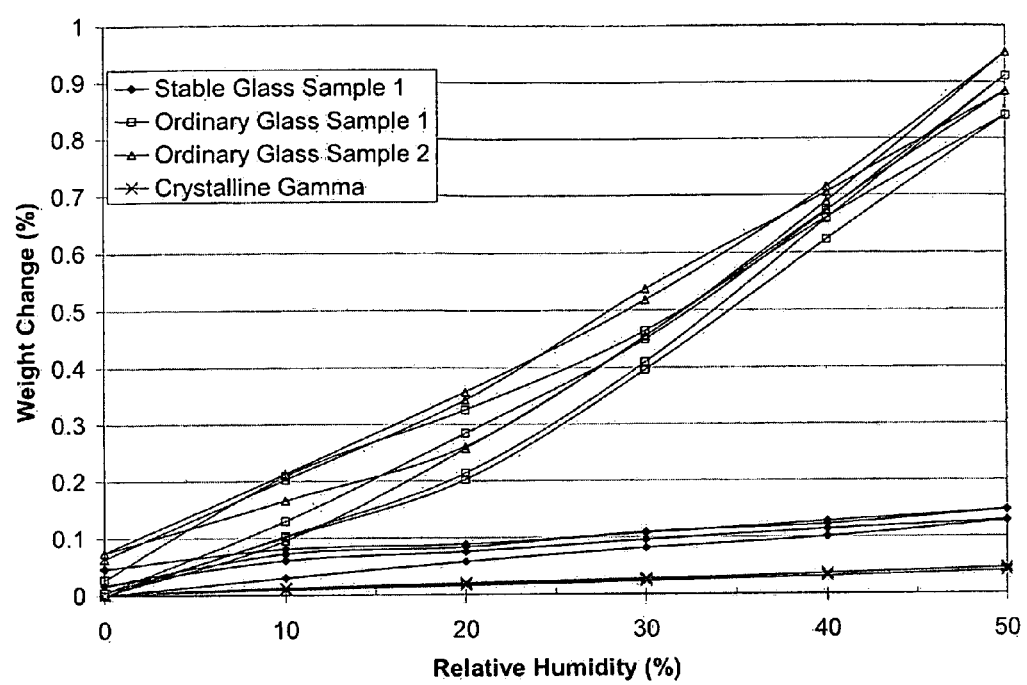
FIG. 10 shows the weight change (percent by mass) as a function of relative humidity for crystalline IMC, ordinary IMC glass, and stable IMC glass. Percent weight changes were observed as a function of relative humidity for stable vapor-deposited IMC glass (black filled diamonds), ordinary IMC glass (sample 1: open squares; sample 2: open triangles) and crystalline IMC (crosses). Lines are guides to the eye.

Weight change as a function of relative humidity was measured for the ordinary glasses, stable glass, and crystalline IMC. The results are shown in FIG. 10. The multiple curves for a given sample are from cycles where the relative humidity (RH) was stepped up and back down. A TA instruments Q5000SA sorption apparatus was used to induce relative humidity step changes and measure the steady-state weight change response. For the crystalline IMC (lowest curve), at 50% RH less than 0.1% weight change was observed. By contrast: the ordinary glass (uppermost curves) absorbed nearly one weight percent at a RH of 50%. The measured percent weight change observed here matches previous data obtained for ordinary IMC glasses and crystalline IMC by Zografi and coworkers. (See Andronis et al., *J. Pharm. Sci.* 86, 346 (1997).)

The stable glass sample showed markedly different behavior than the ordinary glass sample. For example, at a relative humidity of 50%, the stable glass picks up only 0.15 weight percent water, one sixth of its ordinary glass counterpart.

Example 3

Evolution from an Unusually Stable Glass to a Supercooled Liquid

In this experiment, time-dependent heat capacity measurements were obtained to demonstrate the kinetic stability of the present glasses as evidenced by how long it takes them to transform from a solid glass into a supercooled liquid.

The stable glass was prepared by vapor depositing IMC onto an aluminum substrate using the method described in Example 1, above. The substrate was held at a temperature of 265 K and a deposition rate of 2 Å/s was used. For comparison, an "ordinary" glass sample was also prepared by melting the vapor-deposited IMC glass and cooling the resulting liquid at a rate of 40 K/min.

The kinetic stability of the stable IMC glass was explored in quasi-isothermal temperature modulated differential scanning calorimetry (qi-TMDSC) experiments. In these experiments a TA instruments Q2000 DSC was used. After vapor deposition, the samples were placed in the DSC at room temperature. A temperature jump from room temperature to the annealing-temperature was carried out. At room temperature the sample was a glass, and the annealing temperature was chosen such that it was higher than the ordinary glass $T_g$ (315 K). The temperature jump defines t=0. In addition to the instantaneous temperature jump a small sinusoidal temperature fluctuation was imposed (amplitude: 0.5: K, period: 60 seconds) which allows; one to measure the reversing heat capacity as a function of time.

Figure 11A:
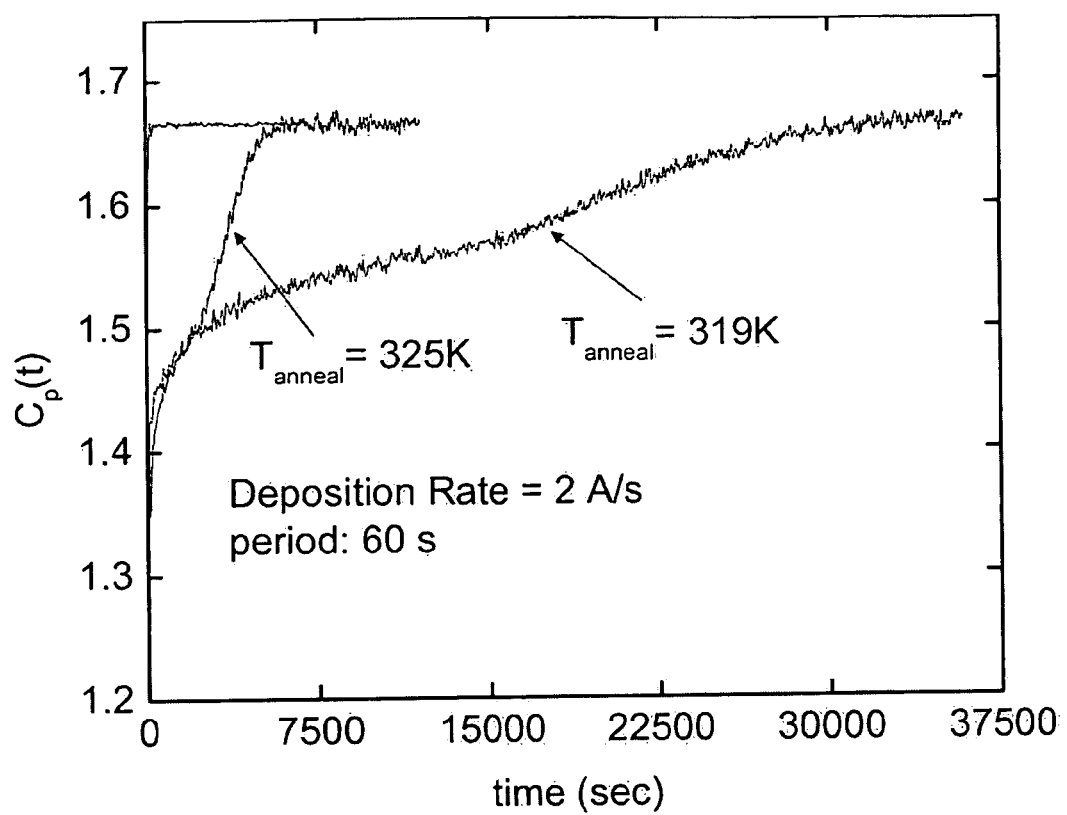
FIG. 11A shows the heat capacity as a function of time Cp(t) for glasses vapor deposited under the same conditions and annealed at different temperatures, in accordance with Example 3.
Figure 11B:
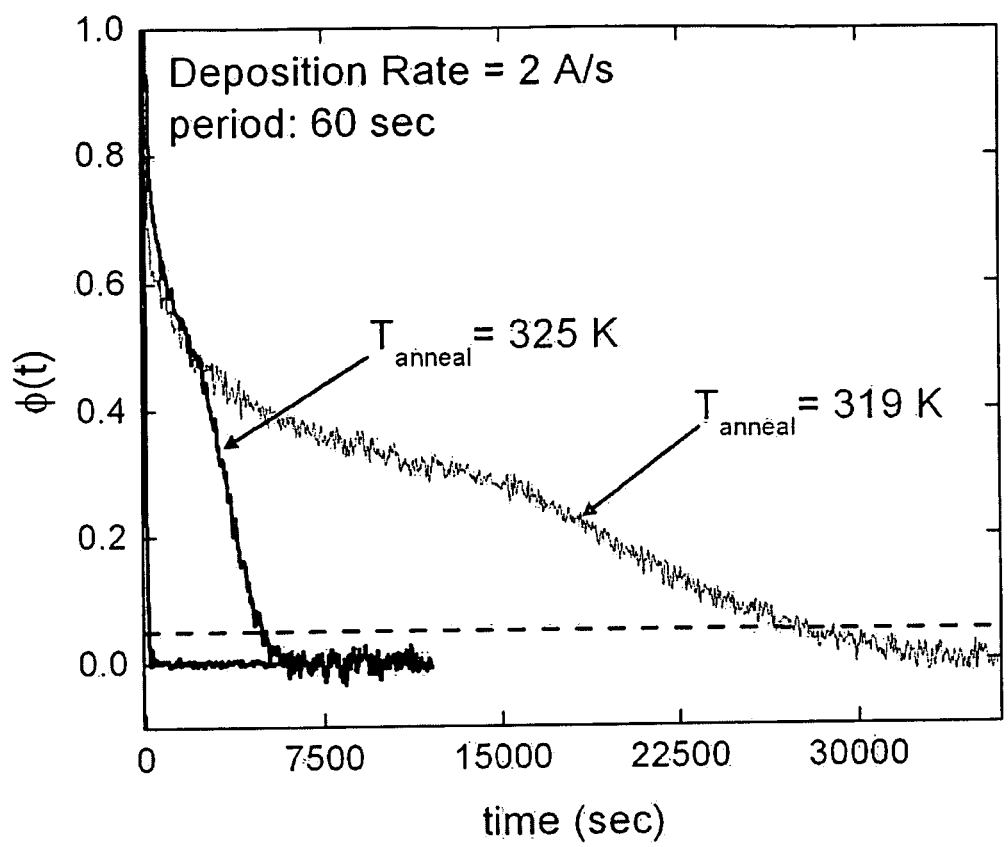
FIG. 11B shows the fraction of glass in the sample as a function of time, in accordance with Example 3.

The response to the temperature jumps was very different for the stable vapor-deposited glass as compared to the ordinary glass, as shown in FIGS. 11A and 11B. FIG. 11A shows the heat capacity as a function of time ($C_p(t)$) for the ordinary glass at $T_{anneal}$=319 K (left most line), and the stable IMC glass annealed at 325 K (center line) and 319 K (right most line). The ordinary glass response was nearly instantaneous; as soon as the temperature was jumped from a temperature below $T_g$ to a temperature above $T_g$ the sample reached a $C_p$ value equal to that of the supercooled liquid at the $T_{anneal}$ of 319 K. In contrast, depending on the annealing temperature, the stable vapor-deposited IMC glasses took 6,000 to 35,000 seconds to reach $C_p$ values equal to the supercooled liquid.

FIG. 11B shows the fraction of glass remaining in the samples, $\phi(t)$, as a function of time calculated from the heat capacity of the ordinary glass, supercooled liquid and time-dependent $C_p$ of the stable glass at the annealing temperature. A value of 1 indicates 100% glass and a value of 0 indicates 100% supercooled liquid. The ordinary glass become a supercooled liquid nearly instantaneously once the temperature was jumped from room temperature to $T_{anneal}$. The response of the stable glass was very different. It took many thousands of seconds to hours to fully transform the stable glass to the supercooled liquid.

Example 4

Production of Unusually Stable Glasses in a Sublimation Apparatus

This example illustrates the formation of unusually stable glasses in a simple sublimation apparatus, rather than a vacuum deposition chamber. A glass container that could be evacuated was used as a sublimation chamber. The lower part of the container held the material to be sublimed ("source material"). A condenser cooled by a circulating coolant was positioned above the source material. At the bottom of the condenser were attached a silicon wafer or aluminum DSC pans, which serves as surfaces for vapor deposition. The source material was heated to sublime by submerging the bottom the sublimation apparatus in an oil bath. The vapor produced by sublimation was deposited on the cooled collecting surfaces. The vacuum maintained during the operation of this device was 8 mTorr. A metal plate was placed over the source material until vapor deposition was to begin, at which time it was withdrawn magnetically. The sublimation rate was controlled by varying the oil bath temperature. Using this apparatus, stable glasses, (as judged by low fictive temperatures) were been made for three pharmaceuticals: indomethacin (IMC), nifedipine, and phenobarbital.

Figure 12A:
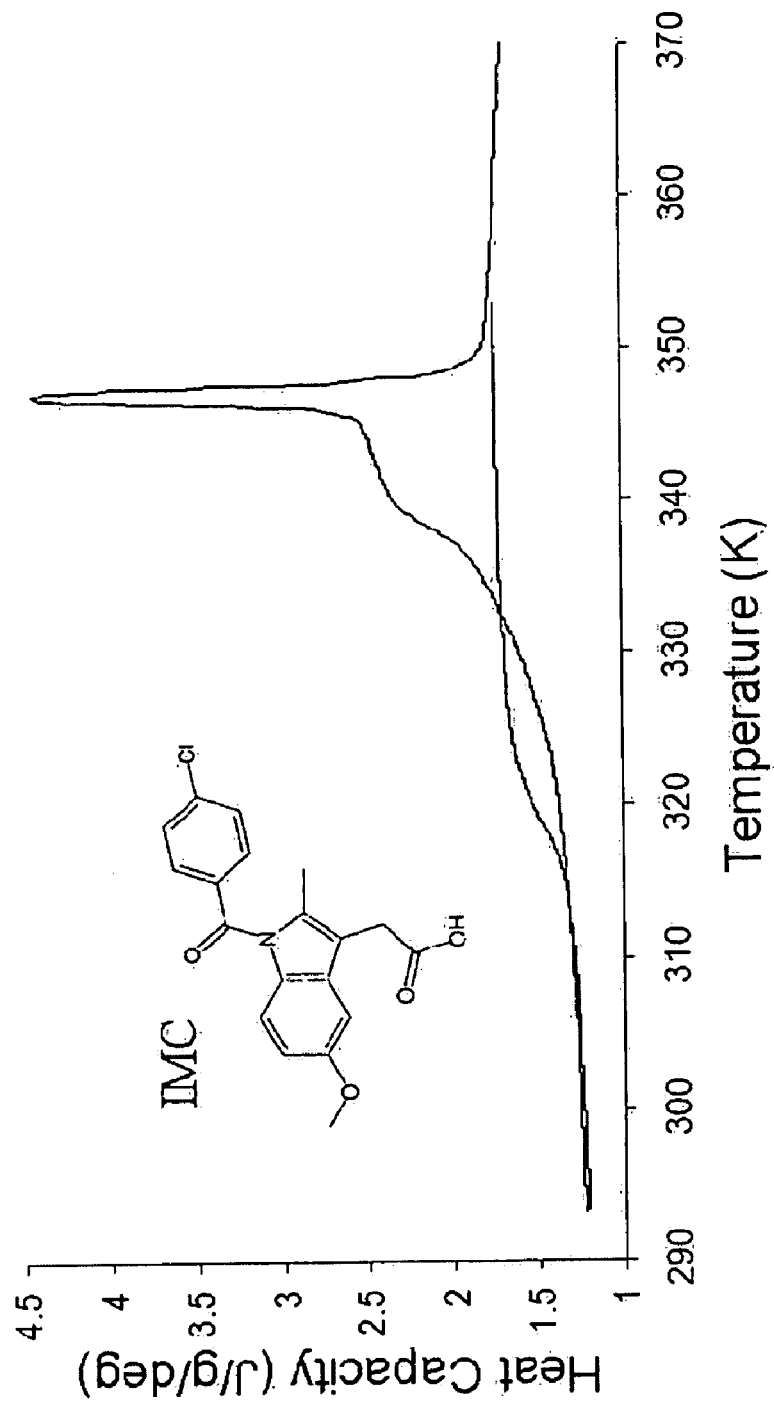
FIG. 12A shows the heat capacity for unusually stable IMC glass and ordinary IMC glass, in accordance with Example 4.
Figure 12B:
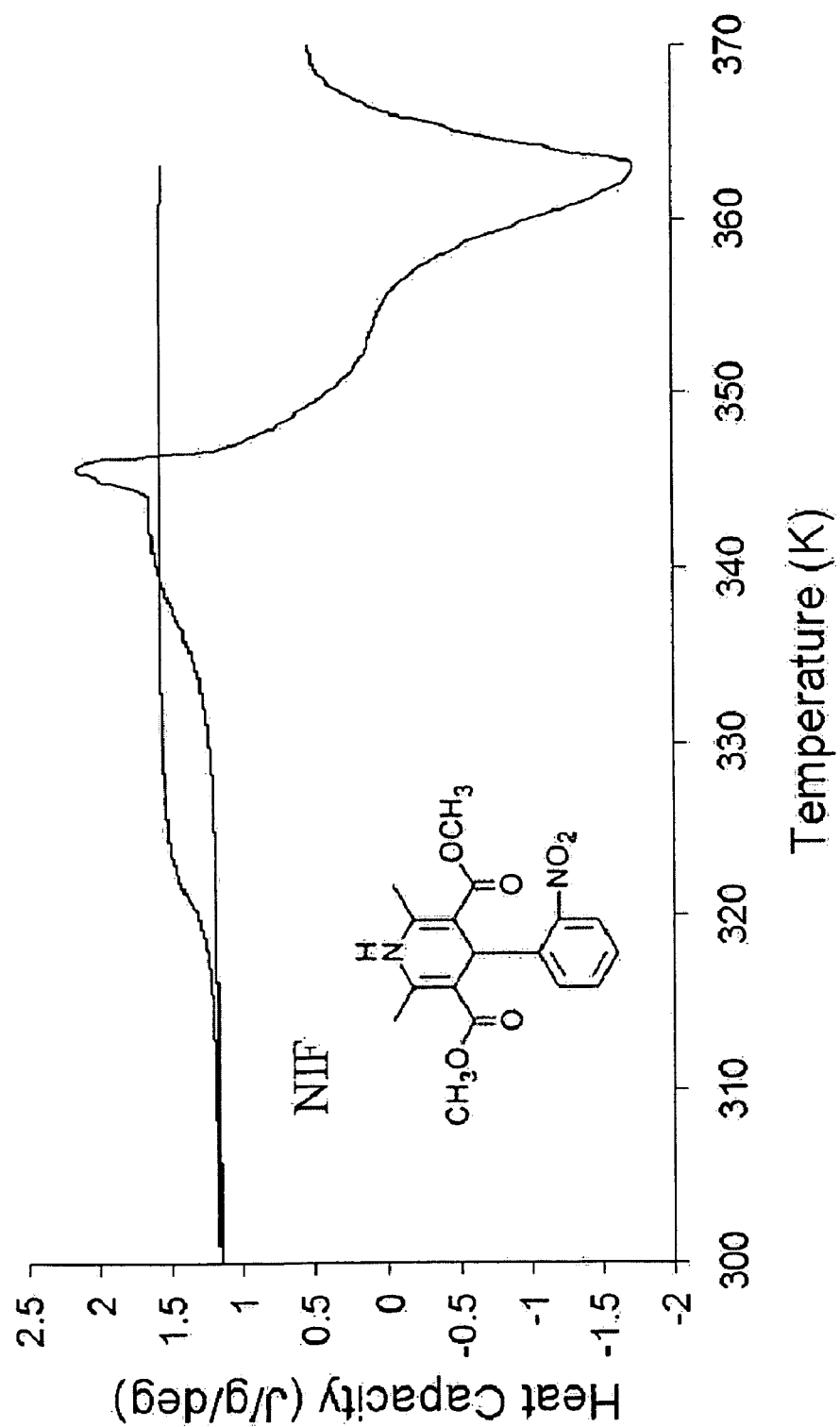
FIG. 12B shows the heat capacity for unusually stable nifedipine glass and ordinary nifedipine glass, in accordance with Example 4.

FIGS. 12A and B, below, compare the DSC traces of the stable glasses made using the sublimation apparatus and the ordinary glasses made by quenching a liquid for IMC and nifedipine. FIG. 12A shows the heat capacities of indomethacin (IMC) glasses measured by DSC. Curve 1 corresponds to a glass prepared by vapor deposition onto a DSC pan held, at approximately $T_g$–50 K at a rate of ~0.2 nm/s. Curve 2 corresponds to an ordinary glass, produced by cooling the liquid at a rate of 10 K/min. FIG. 12B shows the heat capacities of nifedipine glasses measured by DSC. Curve 1 corresponds to a glass prepared by vapor deposition onto a DSC pan at approximately $T_g$–50 K at a rate of ~0.4 nm is. The broad features from 350 to 370 K are due to the crystallization of the material. Curve 2 corresponds to an ordinary glass produced by cooling the liquid at 10 K/min.

Although TNB, IMC and nifedipine are used as examples here, unusually stable glasses may be prepared for many systems that can be vapor-deposited, if surface mobility is enhanced and the substrate temperature is appropriately controlled.

For the purposes of this disclosure, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is understood that the invention is not confined to the particular embodiments set forth herein as illustrative, but embraces all such forms thereof as come within the scope of the following claims.

What is claimed is:

1. A method for forming a stable glass, the method comprising vapor depositing π-conjugated organic molecules onto a substrate to form an amorphous π-conjugated organic glass, wherein the substrate is held at a temperature between 0.8 and 0.9 Tg during deposition, where Tg is the glass transition temperature of the amorphous π-conjugated organic glass, and the deposition rate for the molecules is no more than about 20 nm per second.

2. The method of claim 1, wherein the amorphous π-conjugated organic glass has a thickness of no greater than about 1 μm.

3. The method of claim 1, wherein the stable glass comprises indomethacin.

4. The method of claim 1, wherein the stable glass comprises 1,3-bis-(1-naphthyl)-5-(2-naphthyl)benzene.

5. The method of claim 1, wherein the stable glass comprises nifedipine.

6. The method of claim 1, wherein the amorphous π-conjugated organic glass has a Tg greater than 298K.

7. The method of claim 1, wherein the substrate comprises a pharmaceutical compound.

8. A stable glass made according to the method of claim 1.

9. A pharmaceutical tablet comprising a pharmaceutical compound coated with the stable glass made according to the method of claim 1.

10. The method of claim 1, wherein the amorphous π-conjugated organic glass has a thickness of no greater than about 10 nm.

11. The method of claim 1, wherein the amorphous π-conjugated organic glass has a thickness of about 10 nm to 100 μm.

12. The method of claim 1, wherein the amorphous π-conjugated organic glass is not thermally annealed after it is formed.

13. The method of claim 6, wherein the substrate comprises a pharmaceutical compound.

* * * * *